(12) United States Patent
Gerald, II et al.

(10) Patent No.: US 6,538,444 B2
(45) Date of Patent: Mar. 25, 2003

(54) TWO DIMENSIONAL $B_1$-GRADIENT NMR IMAGER

(75) Inventors: Rex E. Gerald, II, Brookfield, IL (US); Rafael L. Greenblatt, San Diego, CA (US); Jerome W. Rathke, Lockport, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 10/156,174

(22) Filed: May 28, 2002

(65) Prior Publication Data

US 2003/0020474 A1 Jan. 30, 2003

(51) Int. Cl.[7] ................................................ G01V 3/00
(52) U.S. Cl. ........................................ 324/318; 324/309
(58) Field of Search ............................. 324/318, 322, 324/307, 309, 321

(56) References Cited

U.S. PATENT DOCUMENTS

| | | | |
|---|---|---|---|
| 5,045,793 A | 9/1991 | Rathke | 324/318 |
| 5,574,370 A | 11/1996 | Woelk et al. | 324/318 |
| 6,046,592 A | 4/2000 | Rathke et al. | 324/318 |
| 6,191,583 B1 | 2/2001 | Gerald, II et al. | 324/309 |
| 6,469,507 B1 * | 10/2002 | Gerald, II | 324/318 |

* cited by examiner

Primary Examiner—Edward Lefkowitz
Assistant Examiner—Brij B. Shrivastav
(74) Attorney, Agent, or Firm—Joan Pennington

(57) ABSTRACT

A two dimensional $B_1$-gradient NMR imager and methods for non-invasive spectroscopic investigations and imaging of the internal distribution and speciation of materials of fluid, solid, and semisolid objects in two spatial dimensions utilizing a toroid cavity detector. An RF signal transmitter/receiver generates a magnetic field $B_1$ within the toroid cavity and receives a sample response to the magnetic fields $B_0$ and $B_1$. A pivot angle position controller adjusts a pivot angle position of the toroid cavity and enclosed sample to vary an angle between the magnetic field $B_0$ and the central axis of said toroid cavity. A positional rotation controller positions the toroid cavity and enclosed sample at variable angular orientations relative to an initial position and a plane formed by the externally applied static main magnetic field $B_0$ and the central axis of the toroid cavity. A computer sequentially receives and processes sample responses to produce a two-dimensional image.

14 Claims, 7 Drawing Sheets

TWO DIMENSIONAL $B_1$-GRADIENT NMR IMAGER

The United States Government has rights in this invention pursuant to Contract No. W-31–109-ENG-38 between the United States Government and Argonne National Laboratory.

FIELD OF THE INVENTION

The present invention relates nuclear magnetic resonance (NMR) imaging; and more particularly, to a novel two dimensional $B_1$-gradient NMR imager and methods for non-invasive spectroscopic and imaging investigations of the internal distribution and speciation of materials of fluid, solid, and semisolid objects in two spatial dimensions.

DESCRIPTION OF THE RELATED ART

Nuclear magnetic resonance (NMR) analysis is a powerful method by which to determine chemical structures and to examine reaction dynamics in a diversity of chemical and biochemically systems. Magnetic resonance imaging (MI) is also a well established medical tools for non-invasive diagnostics of internal organs in living systems.

For example, U.S. Pat. No. 5,574,370, issued Nov. 12, 1996 to Woelk et al. discloses a toroid cavity detection (TCD) system for determining the spectral properties and distance from a fixed point for a sample using Nuclear Magnetic Resonance. The detection system consists of a toroid with a central conductor oriented along the main axis of the toroidal cylinder and parallel to a static uniform magnetic field, $B_0$. An RF signal is inputted to the central conductor to produce a magnetic field $B_1$ perpendicular to the central axis of the toroid and whose field strength varies as the inverse of the radial position within the toroid. The toroid cavity detection system can be used to encapsulate a sample, or the detection system can be perforated to allow a sample to flow into the detection device or to place the samples in specified sample tubes. The central conductor can also be coated to determine the spectral property of the coating and the coating thickness. The sample is then subjected to the respective magnetic fields and the responses measured to determine the desired properties.

U.S. Pat. No. 6,046,592, issued Apr. 4, 2000 to Rathke et al., discloses a near-electrode imager for employing nuclear magnetic resonance imaging to provide in situ measurements of electrochemical properties of a sample as a function of distance from a working electrode. The near-electrode imager uses the radio frequency field gradient within a cylindrical toroid cavity resonator to provide high-resolution nuclear magnetic resonance spectral information on electrolyte materials.

U.S. Pat. No. 6,191,583, issued Feb. 20, 2001 to Gerald II, discloses a toroid cavity detector that includes an outer cylindrical housing through which extends a wire along the central axis of the cylindrical housing from a closed bottom portion to the closed top end of the cylindrical housing. In order to analyze a sample placed in the housing, the housing is placed in an externally applied static main homogeneous magnetic field ($B_0$). An RF current pulse is supplied through the wire such that an alternately energized and de-energized magnetic field ($B_1$) is produced in the toroid cavity. The $B_1$ field is oriented perpendicular to the $B_0$ field. Following the RF current pulse, the response of the sample to the applied $B_0$ field is detected and analyzed. In order to minimize the detrimental effect of probe ringing, the cylindrically shaped housing is elongated sufficiently in length so that the top and bottom portions are located in weaker, fringe areas of the static main magnetic field $B_0$. In addition, a material that tends to lessen the effect of probe ringing is positioned along the top and bottom ends of the toroid cavity. In another embodiment, a plug is positioned adjacent the inside of the top and bottom ends of the toroid cavity so that the sample contained in the toroid cavity is maintained in the strongest and most homogeneous region of the static magnetic field $B_0$.

The subject matter of each of the U. S. Pat. Nos 5,574,370, 6,046,592, and 6,191,583 is incorporated herein by reference.

A special type of NMR detector, a Magic Angle Spinning NMR (MAS NMR) detector can be used to examine solids. Other researchers have used magic angle spinning NMR to study heterogeneous catalyzed reactions at elevated pressures. Several technical problems, however, limit the use of this technique. For flow-through reactions, which include most industrial processes, the need for rotating seals limits attainable pressures to ~80 pounds per square inch (psi) (~5.5 kPa). Glass, plastic, or ceramic pressure vessels are brittle and further limit pressures to less than 100 psi (6.9 kPa). Metal containers are thus necessary for the high pressures used in industrial applications, but they require that a radio frequency (RF) detector coil be positioned inside the container. Enclosing the RF coil in a metal container complicates the apparatus significantly because the electromagnetic field generated by the RF coil strongly interacts with the electronically conductive surfaces. This electromagnetic interaction reduces the sensitivity and the overall performance of the detector.

U.S. Provisional application 60/308,412 filed Jul. 27, 2001 by Rex E. Gerald II, Robert J. Klingler, Jerome W. Rathke, entitled ROTATIONAL EXCHANGE GRADIENT IMAGER FOR IN SITU MAGNETIC RESONANCE ANALYSIS IN ULTRACENTRIFUGE SEDIMENTATION OF BIOLOGICAL MATERIALS AND RHEOLOGY INVESTIGATIONS discloses a detecting method and detector that expands the capabilities of Nuclear Magnetic Resonance (NMR) analysis, allowing non-conventional materials to be examined using NMR in real time. A Rotational Exchange Gradient Imager (REGI) allows for real-time, in situ investigation of materials subjected to the effects of centrifugal force by nuclear magnetic resonance (NMR) analysis. The REGI comprises a cylindrical stator formed of an electrically conductive, non-magnetic material, a rotor contained in the cylindrical stator formed of an electrically non-conductive, non-magnetic material, and a conductor located along a central axis of the cylindrical stator. A sample is contained within the rotor. The stator and central conductor serve to generate the RF magnetic field for NMR analysis. The rotor containing the sample is rotated within a stable air bearing formed between the cylindrical stator and rotor. In one embodiment, the rotor is driven by high-pressure carrier gas jet containing one or more reactants delivered to the inside of the stator via a closed loop. The central conductor and the stator and rotor are held at a predefined magic angle. In other embodiments, an air jet or a mechanical drive assembly drives the rotor. The mechanical drive assembly is coupled to the rotor and includes a drive motor and a drive gear. Throughout the analysis, the sample contained within the rotor is rotated, stopped, started, and rotation direction reversed with accurate and precise control of the rotation frequency and rotor position. The REGI allows in situ NMR analysis and imaging of processes not possible before; for example, sedimentation of proteins, deformations of soft materials, lubrication, and heterogeneous catalysis under high flow-through gas pressure. The REGI can provide highly detailed information, through NMR spectroscopy and imaging, in diverse fields of science including molecular biology, rheology, tribology, and heterogeneous catalysis.

A principal object of the present invention is to provide an improved nuclear magnetic resonance (NMR) imaging device and methods for non-invasive spectroscopic investigations and imaging of the internal distribution and speciation of materials of fluid, solid, and semisolid objects in two spatial dimensions.

Other important objects of the present invention are to provide such improved NMR imaging device and imaging methods substantially without negative effect; and that overcome some disadvantages of prior art arrangements.

SUMMARY OF THE INVENTION

In brief, a two dimensional $B_1$-gradient NMR imager and methods for non-invasive spectroscopic investigations and imaging of the internal distribution and speciation of materials of fluid, solid, and semisolid objects in two spatial dimensions are provided. The two dimensional $B_1$-gradient nuclear magnetic resonance (NMR).imager includes a hollow electrically conducting cylinder having opposite open cylinder ends. A first cap and a second cap are secured to the opposite open cylinder ends to define a toroid cavity and enclose a sample. An elongate central conductor extends along a central axis of the toroid cavity. A magnet generates an externally applied static main magnetic field $B_0$ to the toroid cavity and the enclosed sample. An RF signal transmitter/receiver coupled to the conductor generates a magnetic field $B_1$ within the toroid cavity and receives a sample response to the magnetic fields $B_0$ and $B_1$. A pivot angle position controller coupled to the cylinder adjusts a pivot angle position of the toroid cavity and enclosed sample to vary an angle θ between the magnetic field $B_0$ and the central axis of the toroid cavity. A positional rotation controller coupled to the cylinder positions the toroid cavity and enclosed sample at variable angular orientations ζ relative to an initial position and a plane formed by the externally applied static main magnetic field $B_0$ and the central axis of the toroid cavity. A computer operatively controls the RF signal transmitter/receiver, the pivot angle position controller and the positional rotation controller, sequentially receiving sample responses. The sample response data is processed to produce a two-dimensional image.

In a first operational embodiment of the invention, sample responses are received at each of a plurality of different angles θ between the magnetic field $B_0$ and the central axis of the toroid cavity at a first angular orientation ζ; and then sample responses are received at each of the plurality of different angles θ at a second different angular orientation ζ.

In a second operational embodiment of the invention, the angle θ between the magnetic field $B_0$ and the central axis of the toroid cavity is set to 90° and sample responses are received at each of a plurality of different angular orientations ζ.

In a third operational embodiment of the invention, the angle θ between the magnetic field $B_0$ and the central axis of the toroid cavity is set to 54.7° and sample responses are received at each of a plurality of different angular orientations ζ.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
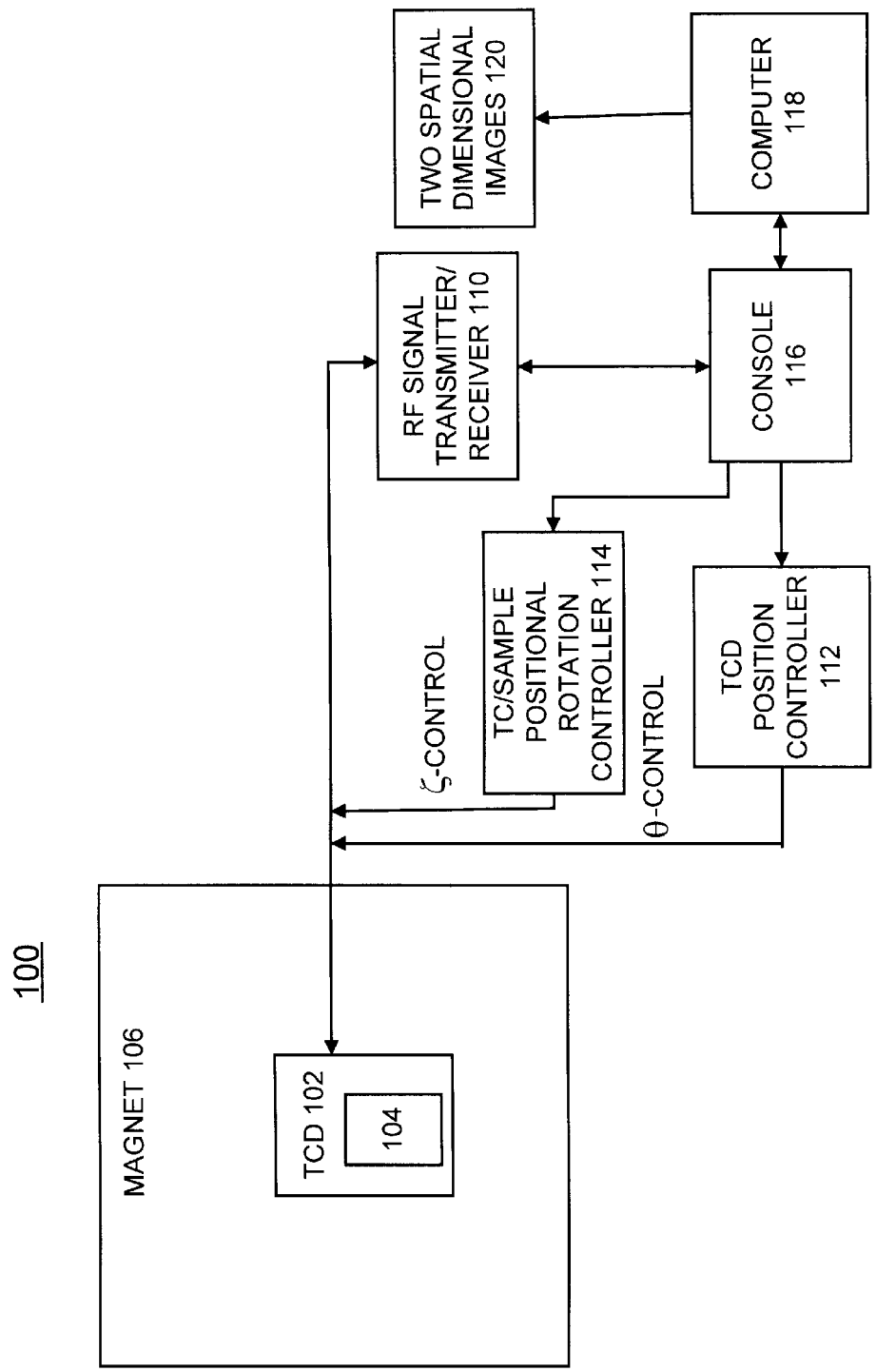
FIG. 1 is a block diagram representation of a two dimensional $B_1$-gradient NMR imager used for implementing methods for non-invasive spectroscopic investigations and imaging of the internal distribution and speciation of materials of fluid, solid, and semisolid objects in two spatial dimensions in accordance with the preferred embodiment.

Having reference now to the drawings, FIG. 1 illustrates a two dimensional $B_1$-gradient NMR imager of the preferred embodiment generally designated by the reference character 100. Two dimensional $B_1$-gradient NMR imager 100 is used for implementing methods for non-invasive spectroscopic investigations and imaging of the internal distribution and speciation of materials of fluid, solid, and semisolid objects in two spatial dimensions. Two dimensional $B_1$-gradient NMR imager 100 includes a toroid cavity detector (TED) 102 containing a sample 104.

In accordance with features of the invention, the two-dimensional $B_1$-gradient nuclear magnetic resonance (NMR) imager 100 is a new and useful analytical device for non-invasive spectroscopic investigations and two dimensional imaging of the internal distribution and speciation of materials within cross sections of fluid, solid, and semisolid objects. The invention comprises a modified toroid cavity detector (TCD) 102, methods for conducting the acquisition of the NMR data, and computer image processing programs for transforming detected data into images with two spatial dimensions.

In the two dimensional $B_1$-gradient NMR imager 100, an externally applied static main magnetic field $B_0$ to the TCD 102 is generated by a magnet 106. Two dimensional $B_1$-gradient NMR imager 100 includes an RF signal transmitter/receiver 110 for applying an RF pulse excitation to the TCD 102 to generate a $B_1$ field within the TCD 102 and receiving the response of the sample 104 to the applied magnetic fields $B_0$ and $B_1$, a TCD position controller 112 providing a pivot θ-control to the TCD 102 to position a pivot position of the TCD 102, and a TC/sample positional rotation controller 114 providing a positional rotation Ðcontrol to the TCD 102 to position the TCD at various orientations relative to a starting or initial position, where ζ represents an angle between an arbitrary Φ position in the TCD and the plane formed by $B_0$ and the axis of the TCD. A console 116 coupled to a computer 118 is operatively coupled to the RF signal transmitter/receiver 110, the TCD position controller 112, and the TC/sample rotation controller 114 for implementing of the NMR data acquisition methods of the preferred embodiment. Computer 118 transforms detected data into two spatial dimensional images 120 using computer image-processing programs for the NMR data acquisition methods of the preferred embodiment.

The imaging methods of the preferred embodiment are an extension of the rotating frame imaging method of NMR imaging. Like that method, two dimensional $B_1$-gradient NMR imager 100 uses spatial variation in the RF magnetic field $B_1$ generated by the probe or TCD 102 to reconstruct spatial information, where earlier methods, for example, magnetic resonance imaging (MRI), use variations in the static magnetic field $B_0$. Using the $B_1$ field means that information about the chemical shift is preserved, and the result is a chart showing the response power as a function of the position and chemical shift of the nuclei producing it.

In a toroid cavity probe, the magnitude of the $B_1$ field varies only with the cylindrical coordinate r, and the direction only with the cylindrical coordinate $\Phi$. Conventionally, the probe is arranged so that $B_1$ is everywhere perpendicular to $B_0$, so that the variation in its direction is of no consequence, and an image with one spatial direction is the result.

In accordance with features of the invention, when the axis of the TCD 102 is inclined with respect to $B_0$ the varying angle between $B_0$ and $B_1$ means that the variation of $B_1$ with both r and $\Phi$ is significant, making a two-dimensional image possible, by varying the orientation of the sample 104 as well as the pulse width of the experiment.

Figure 2:
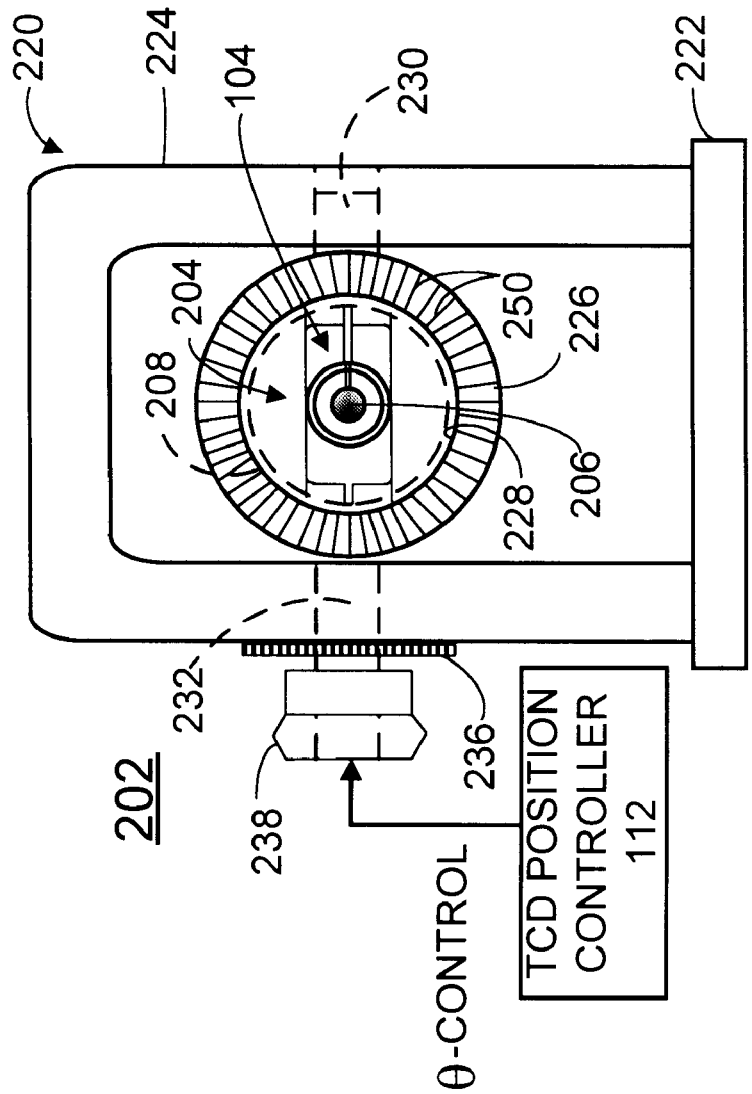
FIG. 2 is a schematic, front view and block diagram representation illustrating an exemplary two dimensional $B_1$-gradient toroid cavity detector of the two dimensional $B_1$-gradient NMR imager of FIG. 1 in accordance with the preferred embodiment.
Figure 3:
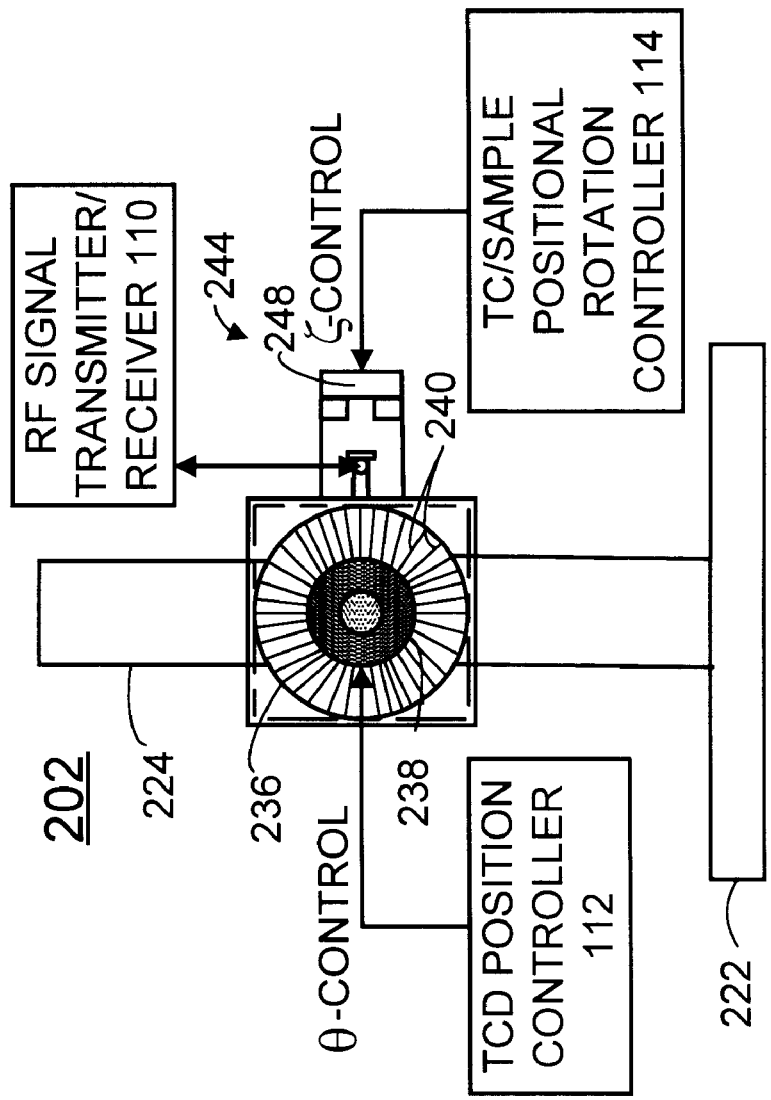
FIG. 3 is a schematic, side view and block diagram representation illustrating the exemplary two dimensional $B_1$-gradient toroid cavity detector of FIG. 2.
Figure 4:
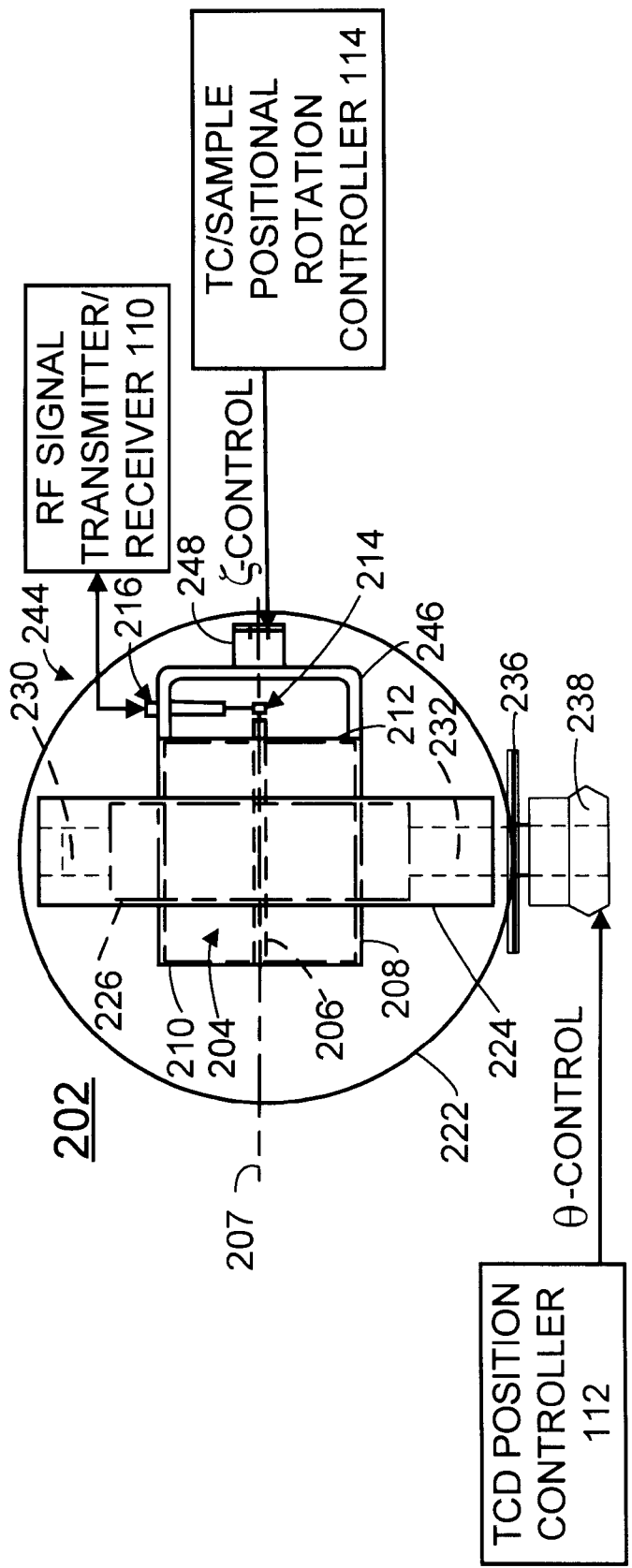
FIG. 4 is a schematic, top view and block diagram representation illustrating the exemplary two dimensional $B_1$-gradient toroid cavity detector of FIG. 2.

Referring now to FIGS. 2–4, an exemplary two dimensional $B_1$-gradient toroid cavity detector generally designated 202 is illustrated not to scale for implementing NMR imaging methods of the preferred embodiment of the two dimensional $B_1$-gradient NMR imager 100. In FIGS. 2–4, interior details of the exemplary TCD 202 are shown in dashed lines. In FIGS. 2–4, TCD 202 is shown in simplified form sufficient for understanding the present invention.

TCD 202 includes a toroid cavity 204 with an elongate central conductor 206 extending along a central axis 207 of the toroid cavity 204 and coupled to the RF signal transmitter/receiver 110 for generating the $B_1$ field within the cavity 204 and receiving a sample response. A hollow cylinder 208 with a respective cap 210, 212 secured at opposite open cylinder ends to the cylinder 208, for example, by screws or other fasteners (not shown), define the toroid cavity 204. The sample 104 is contained inside the toroid cavity 204. An optional sample container can be used to contain the sample 104 within the toroid cavity 204. Cylinder 208 is formed of electrically conductive, non-magnetic material having sufficient mechanical strength for high-pressure applications. For example, cylinder 208 is formed of copper, beryllium copper (BeCu), aluminum, phosphor bronze or titanium. Each of caps 210, 212 similarly is formed of electrical conductive, non-magnetic material having sufficient mechanical strength for high pressure. The caps 210, 212 can be formed of aluminum, copper, beryllium copper, phosphor bronze or titanium. In FIG. 2, cap 212 is removed from the hollow cylinder to illustrate interior details of the TCD 202. The central conductor 206 is fixedly secured to the cap 210 and extends along the central, elongated axis 207 of the toroid cavity 204 through an aligned, central RF dielectric feedthrough in cap 212. The toroid cavity 204 and the central conductor 206 are rotated as one unit.

An RF signal is inputted to the central conductor 206 from the RF signal transmitter/receiver 110 via a capacitance circuit designated by 214 including a matching capacitor Cm with a tuning capacitor Ct connected between the junction of matching capacitor Cm and the central conductor 206 and the cap 212. An RF flexible cable connection designated by 216 rotates unobstructed and couples the central conductor 206 to the RF signal transmitter/receiver 110.

TCD 202 includes a support assembly 220 including a base 222, a vertical, generally U-shaped support member 224 and a support ring member 226. The support ring member 226 receives the toroid cavity cylinder 208 within a central opening 228 and includes a pair of outwardly extending posts 230, 232 received within aligned openings in the U-shaped support member 224. Cylinder 208 is received for rotation within the support ring member 226. The opposed end caps 210, 212 secured to the toroid cavity cylinder 208 function as stops, positioning the cylinder 208 for rotation within the support ring member 226.

A pivot indicator disk 236 and a tilt positioning member 238, such as a gear or pulley, are fixedly mounted to a portion of the support ring post 232 that extends outwardly beyond the U-shaped support member 224. The TCD position controller 112 is coupled to the tilt positioning member 238 as indicated at a line labeled $\theta$-CONTROL to mechanically position the TCD 202. TCD position controller 112 translates computer generated information to mechanically pivot the TCD 202 so that the angle $\theta$ between the external magnetic field $B_0$ and the central axis 207 of the toroid cavity 204 is adjusted to any selected value between 0° and 180°, inclusive. Indicator disk 236 includes markings 240 or other indicia indicating the pivot or tilt angle $\theta$ of the TCD 202.

As shown in FIGS. 3–4, TCD 202 includes a rotation assembly 244 including a bracket 246 and a rotation coupling member 248, such as a gear, coupled to the TC/sample positional rotation controller 114 for positional rotation of the toroid cavity 204 and sample 104 about the axis of the toroid cavity. TC/sample positional rotation controller 114 provides a mechanical rotational and positional drive indicated at a line labeled $\zeta$-CONTROL to the member 248, such as a drive motor and a drive gear assembly (not shown) to operatively control positional rotation of the toroid cavity 204 and sample 104. The support ring member 226 includes markings 250 or other indicia used with a defined feature on cap 212 for indicating the relative position angle $\zeta$ of the toroid cavity 204 and sample 104.

It should be understood that the TCD 102 of the two dimensional $B_1$-gradient NMR imager 100 is not limited to the illustrated exemplary TCD 202 of FIGS. 2–4. It should be understood that various other arrangements of a toroid cavity detector could be provided for implementing NMR imaging methods of the preferred embodiment in the two dimensional $B_1$-gradient NMR imager 100.

Figure 5:
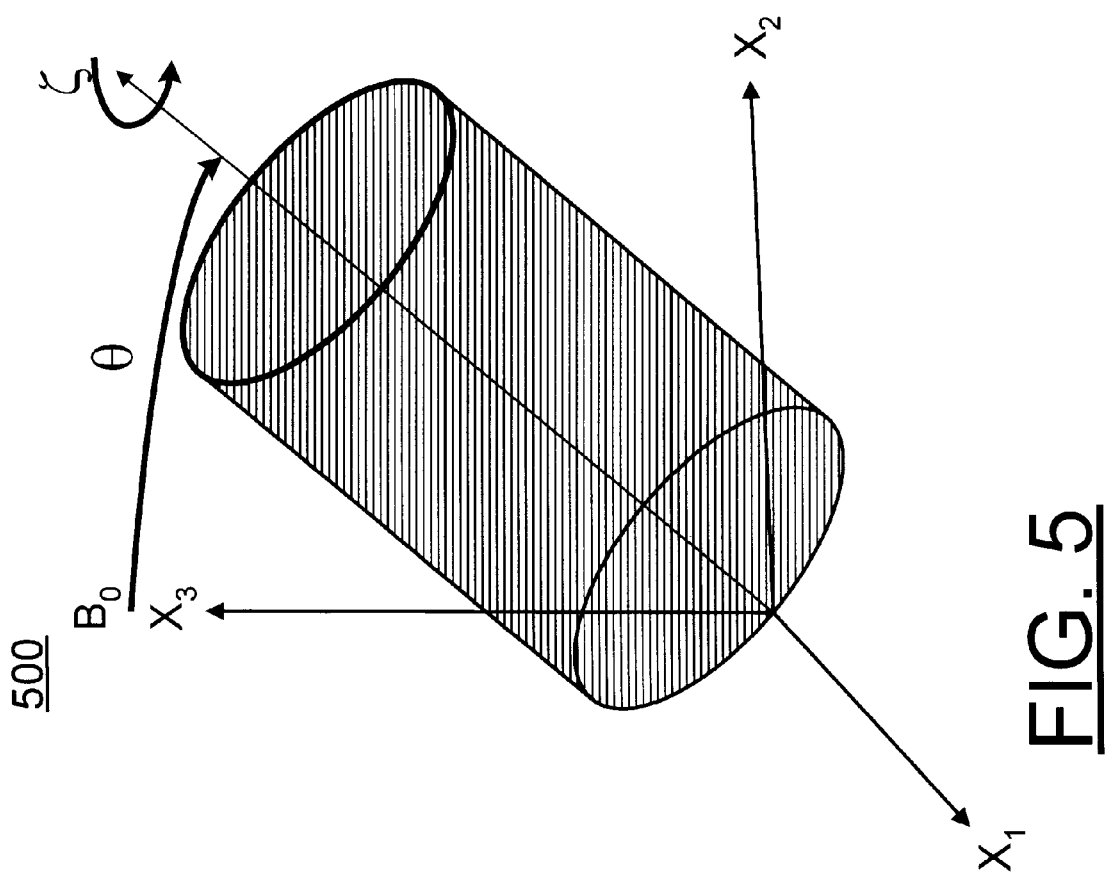
FIGS. 5–7 are diagrams illustrating respective operational embodiments of the two dimensional $B_1$-gradient toroid cavity detector in the two dimensional B1-gradient NMR imager of FIG. 1 in accordance with the preferred embodiments.
Figure 6:
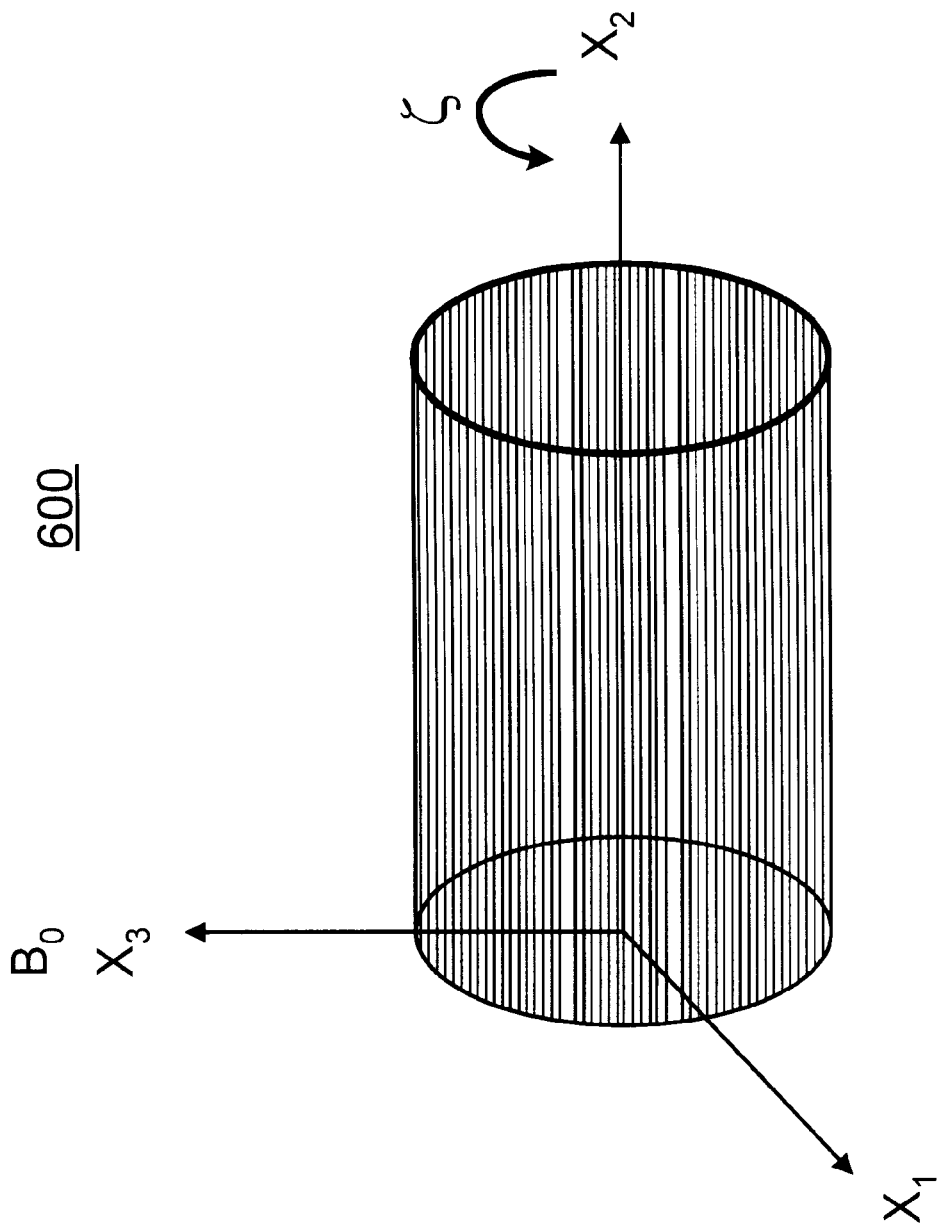
Figure 7:
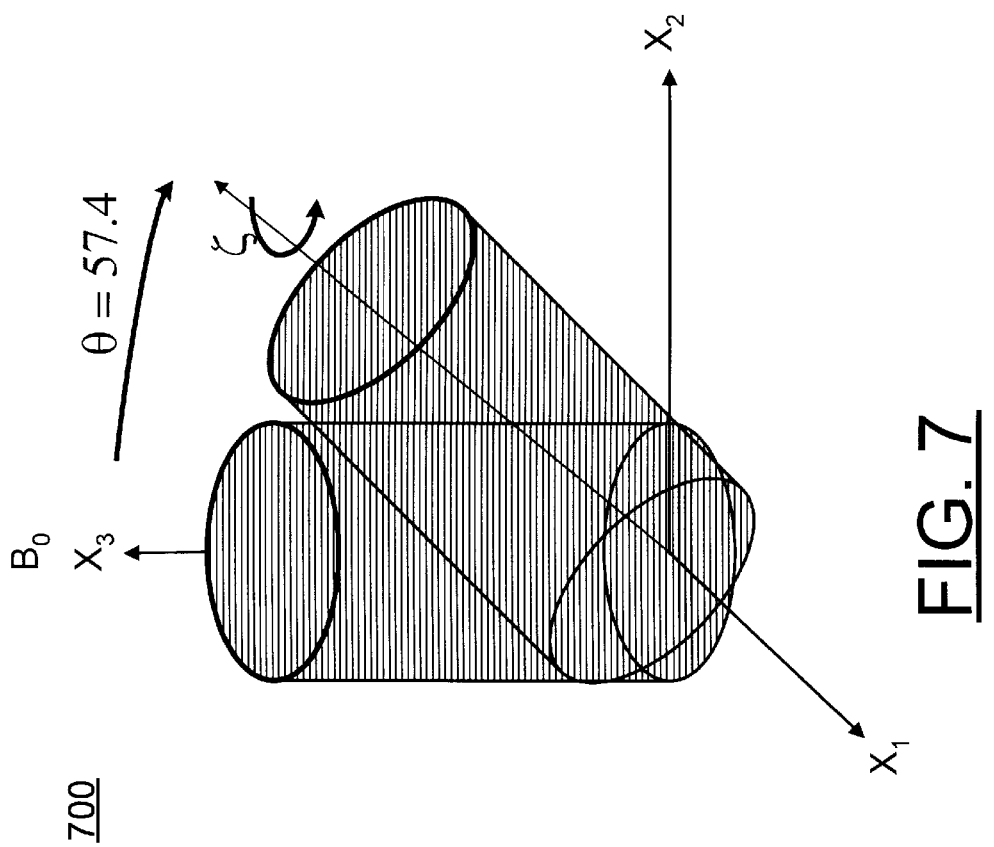

Referring now to FIGS. 5–7, three operational embodiments of the invention are illustrated. In the first embodiment illustrated in FIG. 5 and generally designated 500, the TCD 102 is pivoted so that the angle ($\theta$) between the external magnetic field $B_0$ and an axis of the TCD 102 containing sample 104 can be adjusted to any value between 0° and 180°, inclusive. A standard rotating frame image (RFI) experiment is recorded at each of several different values of $\theta$. Then the standard rotating frame image (RFI) experiment recorded at each of several different values of $\theta$ is repeated at a different angle of $\zeta$, the angle between an arbitrary $\Phi$ position in the TCD and the plane formed by $B_0$ and the axis of the TCD. A minimum of two different values of $\zeta$ are used at each of several different values of $\theta$ for recording RFI partial images. The individual partial images are processed by computer 118 to produce a two-dimensional image with radial (r̂) and angular (Φ̂) unit vectors as the spatial coordinates in a cylindrical coordinate system.

In the second embodiment illustrated in FIG. 6 and generally designated 600, the axis of the TCD is inclined at an angle of 90° with respect to $B_0$, and an RFI experiment is recorded at each of multiple different values of ζ. The individual partial images are processed by a different computer program to produce a two-dimensional image with radial (r̂) and angular (Φ̂) unit vectors as the spatial coordinates in a cylindrical coordinate system.

In the third embodiment illustrated in FIG. 7 and generally designated 700, the axis of the TCD 102 is inclined at the magic angle or 54.7° with respect to $B_0$ and a sample container within the TCD is rotated about that TCD axis 207 at a high speed, for example, 4–40 kHz, and an RFI experiment is recorded at each of several different values of ζ by stroboscopic data acquisition synchronized with the TCD rotation. The individual partial images are processed by yet another different computer program to produce a two-dimensional high-resolution image of a rigid solid with radial (r̂) and angular (Φ̂) unit vectors as the spatial coordinates in a cylindrical coordinate system.

The first two embodiments are particularly useful for NMR spectroscopy and imaging studies of fluid samples that have two-dimensional heterogeneous structures. The third embodiment is particularly useful for NMR spectroscopy and imaging studies of rigid solids, semisolids, and soft matter samples that have two-dimensional heterogeneous structures.

The following specifies how to calculate the actual signal resulting from a certain experiment. The sample response takes the form of a conventional NMR spectrum that changes with the physical orientation of the sample. The orientation of the sample is denoted by Γ. The pulse width is denoted by $\tau_p$. The sample response is denoted by $S(\Gamma, \tau_p; \delta)$. S can be calculated as follows:

Let r denote position within the sample. Let $P(r;\delta)$ be the power per unit volume per unit frequency of the response of the sample at r at frequency δ, and from here on let $B_1$ refer to the component of $B_1$ that is perpendicular to $B_0$. Under the influence of $B_1$, the magnetization at r nutates by an angle $B_1(r,\Gamma)k\tau_p$, where k is a constant related to the magnetic moment of the nuclei in question. The magnetic field produced during the free induction decay (FID) is proportional to the component of the magnetization perpendicular to $B_0$, which is $P(r;\delta)\sin(B_1(r,\Gamma)k\tau_p)$. The current the magnetization component perpendicular to $B_0$ induces in the detector is proportional to $B_1$, so integrating over the sample we get:

$$S(\Gamma, \tau_p; \delta) = \int\int\int_{sample} B_1(r, \Gamma)\sin(B_1(r, \Gamma)k\tau_p)P(r;\delta)dr$$

The toroid cavity detector is typically inclined with respect to the $B_0$ field, and rotated about the axis of the toroid cavity to different positions for acquisitions of NMR spectra. The sample is defined in terms of spin density of chemical shift or frequency δ at a position with coordinates (r,Φ,z). Let (r,Φ,z) be cylindrical coordinates with z parallel to the axis of the toroid, and the origin of Φ fixed with respect to the sample. Then $B_1$ is independent of z, so that the integral over z can be incorporated into P.

The variable Γ represents the inclination and rotation of the sample; two parameters will specify the pivot position and rotational position: angle θ the inclination or pivot of the toroid's axis with respect to $B_0$; and angle ζ, the amount the origin of Φ is shifted or rotated with respect to some reference.

In the coordinates (r,Φ,z), $B_1=(0,A/r,0)$. By transforming $B_1$ into Cartesian coordinates with the same z axis, the following equation is obtained:

$$B_1 = \frac{A}{r}\begin{bmatrix} \cos(\varphi+\zeta) \\ \sin(\varphi+\zeta) \\ 0 \end{bmatrix}$$

Subsequently, by transforming to Cartesian coordinates with an axis coinciding with $B_0$, the following equation is obtained:

$$B_1 = \begin{bmatrix} \cos(\vartheta) & 0 & -\sin(\vartheta) \\ 0 & 1 & 0 \\ \sin(\vartheta) & 0 & \cos(\vartheta) \end{bmatrix} \cdot \frac{A}{r}\begin{bmatrix} \cos(\varphi+\zeta) \\ \sin(\varphi+\zeta) \\ 0 \end{bmatrix} = \frac{A}{r}\begin{bmatrix} \cos(\vartheta)\cos(\varphi+\zeta) \\ \sin(\varphi+\zeta) \\ \sin(\vartheta)\cos(\varphi+\zeta) \end{bmatrix}$$

$$\Rightarrow B_1 = \frac{A}{r}\sqrt{\cos^2(\vartheta)\cos^2(\varphi+\zeta) + \sin^2(\varphi+\zeta)}$$

And so:

$$S(\vartheta, \zeta, \tau_p; \delta) = \int\int B_1(r, \phi, \vartheta, \zeta)\sin(B_1(r, \phi, \vartheta, \zeta)k\tau_p)P(r, \phi; \delta)2\pi r dr d\varphi$$

$$= \int\int \frac{A}{r}\sqrt{\cos^2(\vartheta)\cos^2(\varphi+\zeta) + \sin^2(\varphi+\zeta)}$$

$$\sin\left(\frac{A}{r}\sqrt{\cos^2(\vartheta)\cos^2(\varphi+\zeta) + \sin^2(\varphi+\zeta)}\,k\tau_p\right)$$

$$P(r, \phi; \delta)2\pi r dr d\varphi$$

The expression relating the sample response to the characteristics of the sample has the form:

$$S(x_1, x_2) = \int\int T(x_1, x_2, y_1, y_2)P(y_1, y_2)dy_1 dy_2$$

Since discrete data is considered here, the following holds:

$$S_{x_1 x_2 x_3} = \sum_{y_1}\sum_{y_2} T_{x_1 x_2 x_3}^{y_1 y_2} P_{y_1 y_2}$$

that is, a linear transformation of a two-dimensional array into a three-dimensional construct. The elements of the previous equation can be rearranged so that S and P are one-dimensional and T is two-dimensional. The same transformation then takes the form:

$$S_i = \sum_j T_i^j P_j$$

which is a matrix multiplication. The previous equation is invertible so long as T is nonsingular. The requirement of nonsingularity corresponds to choosing the conditions of the experiment so that none of the data taken are redundant, and the number of data points taken is the same as the number 20 of points that will appear in the image.

The obvious solution of the inverse problem is to invert the matrix $T_i^j$, is computationally intensive but can be solved. The matrix is determined only by the choices of (θ,ζ,$\tau_p$) and the values of (r,Φ) for the output. It is possible to select standard values for these variables, and produce 'tables' of $T^{-1}$.

While the present invention has been described with reference to the details of the embodiments of the invention shown in the drawing, these details are not intended to limit the scope of the invention as claimed in the appended claims.

What is claimed is:

1. A two dimensional $B_1$-gradient nuclear magnetic resonance (NMR) imager for in situ, non-invasive spectroscopic investigations and imaging of the internal distribution and speciation of materials of fluid, solid, and semisolid objects in two spatial dimensions, said NMR imager comprising:

a hollow electrically conducting cylinder having opposite open cylinder ends, a first cap and a second cap secured to said opposite open cylinder ends to define a toroid cavity and enclose a sample;

an elongate central conductor extending along a central axis of said toroid cavity;

a magnet for generating an externally applied static main magnetic field $B_0$ to said toroid cavity and said enclosed sample;

an RF signal transmitter/receiver coupled to said conductor for generating a magnetic field $B_1$ within said toroid cavity and for receiving a sample response to said magnetic fields $B_0$ and $B_1$;

a pivot angle position controller coupled to said cylinder for adjusting a pivot angle position of said toroid cavity and enclosed sample to vary an angle between said magnetic field $B_0$ and said central axis of said toroid cavity; and a positional rotation controller coupled to said cylinder for positioning said toroid cavity and enclosed sample at variable angular orientations relative to an initial position and a plane formed by said externally applied static main magnetic field $B_0$ and said central axis of said toroid cavity, and a computer for operatively controlling said RF signal transmitter/receiver, said pivot angle position controller and said positional rotation controller for sequentially receiving sample responses and for transforming said sample responses to produce a two-dimensional image.

2. The NMR imager as recited in claim 1 wherein said elongate central conductor is fixedly secured to said first cap and extends along said central axis of said toroid cavity through an aligned, central feedthrough in said second cap.

3. The NMR imager as recited in claim 1 wherein said cylinder, said first cap and said second cap are formed of electrically conductive material, non-magnetic material.

4. The NMR imager as recited in claim 3 wherein said electrically conductive material, non-magnetic material is a selected one of copper, beryllium copper (BeCu), aluminum, phosphor bronze or titanium.

5. The NMR imager as recited in claim 1 includes a support assembly supporting said cylinder and wherein said pivot angle position controller is coupled to said support assembly for adjusting said pivot angle position of said toroid cavity and enclosed sample to vary an angle between said magnetic field $B_0$ and said central axis of said toroid cavity.

6. The NMR imager as recited in claim 1 wherein $\theta$ represents said angle between said magnetic field $B_0$ and said central axis of said toroid cavity and said angle $\theta$ is adjusted by said pivot angle position controller to at least one selected value between 0° and 180°.

7. The NMR imager as recited in claim 1 wherein $\zeta$ represents said variable angular orientations relative to an initial position and a plane formed by said externally applied static main magnetic field $B_0$ and said central axis of said toroid cavity; and said variable angular orientations $\zeta$ is adjusted by said positional rotation controller to a plurality of selected values between 0° and 360°.

8. A nuclear magnetic resonance (NMR) method for in situ, non-invasive spectroscopic investigations and imaging of the internal distribution and speciation of materials of fluid, solid, and semisolid objects in two spatial dimensions, said NMR imaging method comprising the steps of:

providing a toroid cavity detector including a cylinder defining a toroid cavity and enclosing a sample and an elongate central conductor extending along a central axis of said toroid cavity;

generating an externally applied static main magnetic field $B_0$ to said toroid cavity and said enclosed sample;

utilizing a pivot angle position controller coupled to said toroid cavity detector, adjusting a pivot angle position of said toroid cavity and enclosed sample to vary an angle $\theta$ between said magnetic field $B_0$ and said central axis of said toroid cavity;

utilizing a positional rotation controller coupled to said toroid cavity detector, positioning said toroid cavity and enclosed sample at variable angular orientations $\zeta$ relative to an initial position and a plane formed by said externally applied static main magnetic field $B_0$ and said central axis of said toroid cavity;

utilizing a RF signal transmitter/receiver generating a magnetic field $B_1$ within said toroid cavity and receiving a sample response to said magnetic fields $B_0$ and $B_1$;

operatively controlling said RF signal transmitter/receiver, said pivot angle position controller and said positional rotation controller and sequentially receiving sample responses; and processing said sample responses to produce a two-dimensional image.

9. The NMR imaging method of claim 8 wherein the step of operatively controlling said RF signal transmitter/receiver, said pivot angle position controller and said positional rotation controller and sequentially receiving sample responses includes the steps of generating said magnetic field $B_1$ within said toroid cavity and receiving sample responses at each of a plurality of different values of $\theta$ at a first angle of $\zeta$; and providing a second different angle of $\theta$ and repeating the steps of generating said magnetic field $B_1$ within said toroid cavity and receiving sample responses at each of said plurality of different values of $\theta$.

10. The NMR imaging method of claim 9 wherein said plurality of different values of $\theta$ between said magnetic field $B_0$ and said central axis of said toroid cavity are selected values between 0 and 180° and wherein said first and said second values of $\zeta$ are selected values between 0° and 360°.

11. The NMR imaging method of claim 8 wherein the step of operatively controlling said RF signal transmitter/receiver, said pivot angle position controller and said positional rotation controller and sequentially receiving sample responses includes the steps of adjusting said pivot angle position of said toroid cavity and enclosed sample to a selected angle $\theta$ between said magnetic field $B_0$ and said central axis of said toroid cavity; generating said magnetic field $B_1$ within said toroid cavity and receiving sample responses at each of a plurality of different values of $\zeta$.

12. The NMR imaging method of claim 11 wherein said selected angle $\theta$ between said magnetic field $B_0$ and said central axis of said toroid cavity is 90° and wherein said plurality of different values of $\zeta$ are selected values between 0° and 360°.

13. The NMR imaging method of claim 11 wherein said selected angle $\theta$ between said magnetic field $B_0$ and said central axis of said toroid cavity is 54.7° and wherein said plurality of different values of $\zeta$ are selected values between 0° and 360°.

14. The NMR imaging method of claim 13 wherein said sample is contained in a sample container within said toroid cavity and said sample container is rotated at a predefined speed, and stroboscopic data acquisition is synchronized with the sample container rotation.

* * * * *